United States Patent
Li

[19]

[11] Patent Number: 6,154,418
[45] Date of Patent: *Nov. 28, 2000

[54] WRITE SCHEME FOR A DOUBLE DATA RATE SDRAM

[75] Inventor: Wen Li, Boise, Id.

[73] Assignee: Micron Technology, Inc., Boise, Id.

[*] Notice: This patent is subject to a terminal disclaimer.

[21] Appl. No.: 09/503,212

[22] Filed: Feb. 14, 2000

Related U.S. Application Data

[63] Continuation of application No. 09/204,074, Dec. 3, 1998, Pat. No. 6,081,477.

[51] Int. Cl.⁷ .................................................. G11C 8/00
[52] U.S. Cl. .................................................. 365/233
[58] Field of Search ............................... 365/233, 230.03

[56] References Cited

U.S. PATENT DOCUMENTS

| | | | |
|---|---|---|---|
| 5,592,434 | 1/1997 | Iwamoto et al. | 365/233 |
| 5,673,233 | 9/1997 | Wright et al. | 365/233 |
| 5,703,830 | 12/1997 | Yasuhiro | 365/233 |
| 5,748,551 | 5/1998 | Ryan et al. | 365/230.03 |
| 5,757,703 | 5/1998 | Merritt et al. | 365/233 |

*Primary Examiner*—Trong Phan
*Attorney, Agent, or Firm*—Dickstein Shaprio Morin & Oshinsky LLP

[57] ABSTRACT

A double data rate (DDR) synchronous dynamic random access memory (SDRAM) device with at least one memory bank is disclosed. Each memory bank is divided into two independent and simultaneously accessible memory planes. Input data aligned with the rising edge of a data strobe (DQS) and input data aligned with the falling edge of the DQS are separately latched coincident with the respective edges of the DQS. Using an internal clock, the latched input data is re-aligned and simultaneously sent to both planes of an addressed memory bank at the rising edge of the internal clock. With this configuration, the internal processing of the SDRAM is unaffected by latency variations of the DQS.

19 Claims, 6 Drawing Sheets

WRITE SCHEME FOR A DOUBLE DATA RATE SDRAM

This application is a continuation of application Ser. No. 09/204,074, filed on Dec. 3, 1998, now U.S. Pat. No. 6,081,477, which is hereby incorporated by reference.

BACKGROUND OF THE INVENTION

1. Field of the Invention

The present invention relates to the field of semiconductor memory devices and, more particularly to a write scheme for double data rate (DDR) synchronous dynamic random access memory (SDRAM) devices.

2. Description of the Related Art

There is a demand for faster, higher capacity, random access memory (RAM) devices. RAM devices, such as dynamic random access memory (DRAM) are typically used as the main memory in computer systems. Although the operating speed of the DRAM has improved over the years, the speed has not reached that of the processors used to access the DRAM. In a computer system, for example, the slow access and cycle times of the DRAM lead to system bottlenecks. These bottlenecks slow down the throughput of the system despite the very fast operating speed of the system's processor.

A newer type of memory known as a synchronous dynamic random access memory (SDRAM) has been developed to provide faster operation in a synchronous manner. SDRAMs are designed to operate synchronously with the system clock. That is, input and output data of the SDRAM are synchronized to an active edge of the system clock which is driving the processor accessing the SDRAM.

Some SDRAMs are capable of synchronously providing burst data at a high-speed data rate by automatically generating a column addresses for a memory array of storage cells organized into rows and columns. In addition, some SDRAMs utilize two or more banks of memory arrays which permits interleaving data between the banks to reduce access times and increase the speed of the memory.

Although SDRAMs have overcome some of the timing disadvantages of other memory devices, such as DRAMs, there is still a need for faster memory devices. Double data rate (DDR) SDRAMs are being developed to provide twice the operating speed of the conventional SDRAM. These devices allow data transfers on both the rising and falling edges of the system clock and thus, provide twice as much data as the conventional SDRAM. DDR SDRAMs are also capable of providing burst data at a high-speed data rate.

Due to the high speed data transfers, DDR SDRAMs use a bi-directional data strobe (DQS) to register the data being input or output on both edges of the system clock. According to industry standards, when data is being received by the DDR SDRAM, the DQS has a known latency which varies between ¾ of the system clock cycle (minimum latency) to 5/4 of the clock cycle (maximum latency). When data is being received by the SDRAM, the system clock cannot be properly synchronized with the DQS because of the latency variation and thus, the system clock cannot be properly synchronized with the input data. To compensate for the latency variations, the DDR SDRAM must adjust the generation of column select addresses as each piece of input data is received so that they are synchronized with the arrival of the input data. This involves a complex writing scheme affecting the internal processing of the SDRAM and adds an unnecessary latency to the input data particularly for a burst access of several pieces of data. Accordingly, there is a desire and need for a simplified writing scheme for a DDR SDRAM which compensates for the latency variation in the DQS.

SUMMARY OF THE INVENTION

The present invention provides a simplified writing scheme for a double data rate (DDR) synchronous dynamic random access memory (SDRAM) device.

The above and other features and advantages of the invention are achieved by providing a DDR SDRAM with at least one memory bank. Each memory bank is divided into two independent and simultaneously accessible memory planes. Input data aligned with the rising edge of a data strobe (DQS) and input data aligned with the falling edge of the DQS are separately latched coincident with the respective edges of the DQS. Using an internal clock, the latched input data is re-aligned and simultaneously sent to both planes of an addressed memory bank at the rising edge of the internal clock. With this configuration, the internal processing of the SDRAM is unaffected by latency variations of the DQS.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

Figure 1:
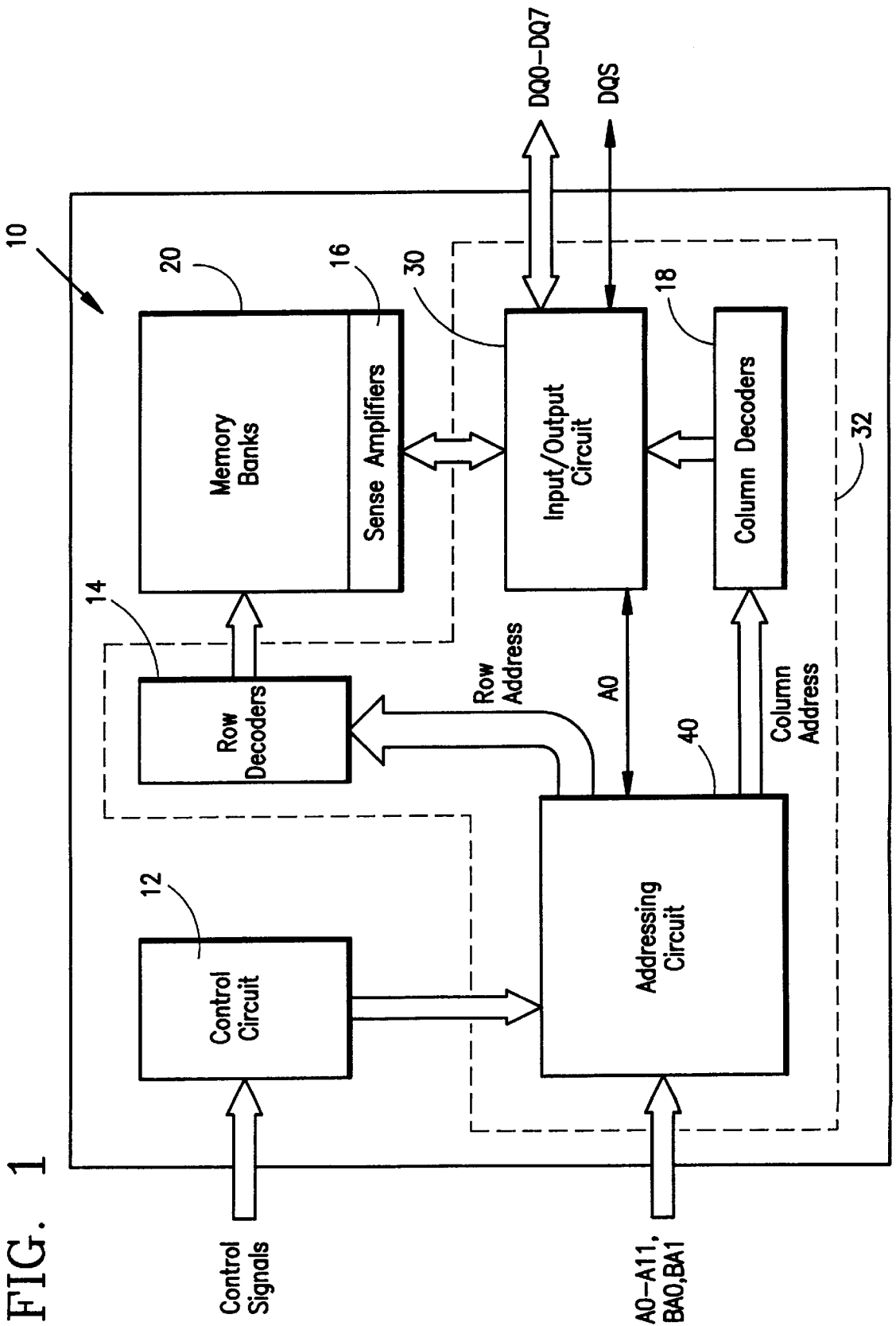
FIG. 1 illustrates a synchronous dynamic random access memory (SDRAM) constructed in accordance with a preferred embodiment of the present invention.

FIG. 1 illustrates a SDRAM 10 constructed in accordance with a preferred embodiment of the present invention. The SDRAM 10 includes a control circuit 12, addressing circuit 40, input/output circuit 30, memory banks 20, sense amplifier circuits 16, column decoders 18 and row decoders 14. In a preferred embodiment, four memory banks 20, sense amplifier circuits 16, column decoders 18 and row decoders 14 are used, but for convenience purposes only, FIG. 1 illustrates one memory bank 20, sense amplifier circuit 16, column decoder 18 and row decoder 14. In a preferred embodiment, four memory banks 20, are used, but it must be noted that the present invention can utilize, for example, one, two, four, eight or more memory banks 20, etc. The row and column decoders 14, 18, addressing circuit 30 and input/output logic circuit 30 comprise a write path circuit 32 providing a data path for writing data into the banks 20 from an external device (through input/output pins DQ0–DQ7). It must be noted that the illustrated configuration of the write path circuit 32 is but one of many possible configurations and the invention is not to be so limited to the specific circuit illustrated in FIG. 1.

Preferably, the SDRAM 10 contains eight input/output pins DQ0–DQ7. This is referred to as a "×8" device since eight bits are input or output at one time. It must be noted that the SDRAM 10 can also be configured to have four input/output pins (i.e., a "×4" device), sixteen input/output pins (i.e., a "×16" device) or more.

Each of the memory banks 20 contain memory cells arranged in rows and columns and are connected to a respective row decoder 14 and sense amplifier circuit 16. Preferably, the size of the memory banks 20 are at least 16 M each (that is, 16,777,216 individual memory cells or "bits"), although any size bank 20 can be used.

Figure 2:
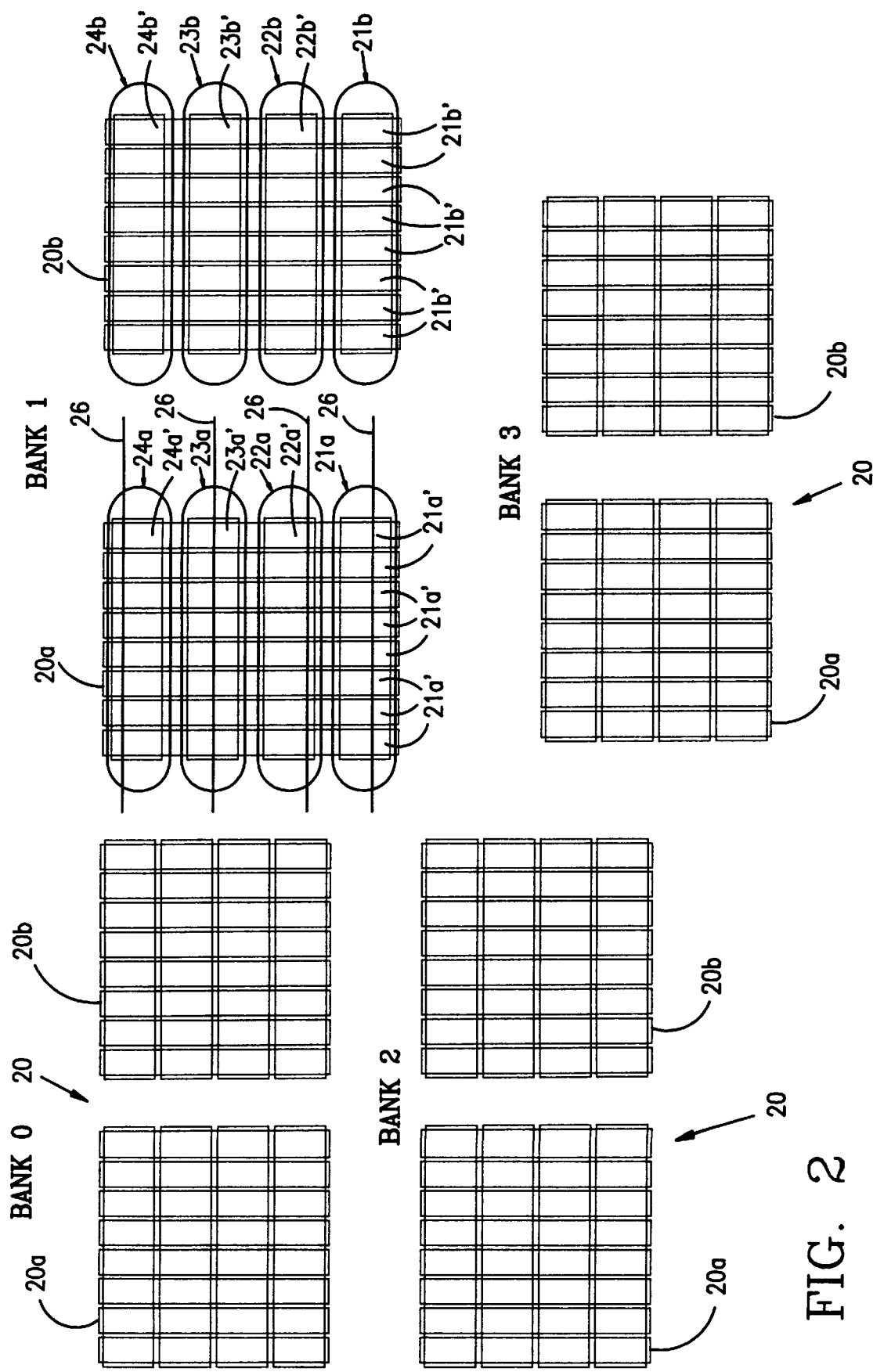
FIG. 2 illustrates an exemplary configuration of memory banks utilized in the SDRAM of FIG. 1.

As illustrated in FIG. 2, each of the four memory banks 20 (also individually labeled as BANK 0, 1, 2 and 3) are divided into two planes 20a, 20b. Each plane 20a is further broken down into four column sections, i.e., sections 21a, 22a, 23a, 24a. Likewise, each plane 20b is further broken down into four column sections, i.e., sections 21b, 22b, 23b, 24b.

As is known in the art, each column section 21a, 22a, 23a, 24a for plane 20a respectively maps to two input/output pins DQ0–DQ7 when the SDRAM 10 is configured as "×8." As is known in the art, each column section 21a, 22a, 23a, 24a for plane 20a respectively maps to one input/output pin DQ0–DQ3 when the SDRAM 10 is configured as "×4." Likewise, each column section 21b, 22b, 23b, 24b for plane 20b respectively maps to two input/output pins DQ0–DQ7 when the SDRAM 10 is configured as "×8" while each column section 21b, 22b, 23b, 24b for plane 20b respectively maps to one input/output pin DQ0–DQ3 when the SDRAM 10 is configured as "×4."

FIG. 2 also illustrates how the column section 21a for plane 20a can be organized into eight subsections, i.e., eight subsections 21a'. It must be noted that column sections 22a, 23a, 24a for plane 20a can also be respectively organized into eight subsections, i.e., eight subsections 22a, eight subsections 23a' and eight subsections 24a'. Likewise, FIG. 2 illustrates how the column section 21b for plane 20b can be organized into eight subsections, i.e., eight subsections 21b'. It must be noted that column sections 22b, 23b, 24b for plane 20b can also be respectively organized into eight subsections each, i.e., eight subsections, 22b', eight subsections 23b' and eight subsections 24b'.

When one column select signal 26 is received in one plane, e.g., plane 20a of a memory bank 20, one column from each of the column sections 21a, 22a, 23a, 24a is activated (collectively referred to herein as a column for a plane 20a). That is, an individual column is activated in section 21a, an individual column is activated in section 22a, an individual column is activated in section 23a and an individual column is activated in section 24a. If column section 21a, for example, were split into eight subsections, e.g. subsections 20a', one column from one of the respective subsections would be activated. In addition, four bits of memory (if the SDRAM 10 is "×8") are activated within each section 21a, 22a, 23a, 24a. Therefore, with one column select signal 26, sixteen bits of information for the plane 20a are accessible. The input/output circuit 30 determines which bits of the activated plane 20a are mapped to the input/output pins DQ0–DQ7. A column select signal 26 received in plane 20b, will activate one column in each of the column sections 21b, 22b, 23b, 22b in a similar manner.

Each plane 20a, 20b of a memory bank 20 operates independently of each other and thus, both planes 20a, 20b may be accessed at the same time. This doubles the amount of data being accessed in a memory bank 20. As will be discussed in further detail with reference to FIGS. 3 and 4, in a write operation the write path circuitry 32 will latch and re-align two sets of input data received over the input/output pins DQ0–DQ7 and then simultaneously send this information to the two planes 20a, 20b of a bank 20.

Referring again to FIG. 1, each of the memory banks 20 are also connected to the input/output circuit 30 which is connected to the four column decoders 18. The input/output circuit 30 includes conventional read circuitry (not shown) for outputting data from the memory banks 20 to input/output pins DQ0–DQ7. The input/output circuit 30 also includes conventional write circuitry (not shown) for inputting data received on the input/output pins DQ0–DQ7 into the memory banks 20. Accordingly, the input/output circuit 30 provides a path for data being transmitted between the memory banks 20 and an external device (connected to the input/output pins DQ0–DQ7). The input/output circuit 30 is also connected to a data strobe DQS. The data strobe DQS is a bi-directional signal that is received when input data arrives (data write operation) and is transmitted along with output data (data read operation).

The control circuit 12 is connected to the addressing circuit 40 and receives control signals as an input. The control circuit 12 includes conventional command decoder circuitry (not shown) used to interpret the control signals and drive the remaining circuitry of the SDRAM 10. As is known in the art, the control signals include a system clock CLK, clock enable CKE, column address strobe (CAS#), row address strobe (RAS#), write enable (WE#), and chip select (CS#) signals (the # designation indicates that the signal is active low). The CAS#, RAS#, WE#, and CS# signals define the commands received by the control logic 12 while the CLK and CKE signals are used to synchronize the operation of the SDRAM 10 to the external system clock.

Distinct combinations of the control signals constitute distinct commands. For example, the combination of RAS# low, CAS# high and WE# low represents a PRECHARGE command. A PRECHARGE command is used to deactivate an open (or activated) row of memory cells within a memory bank 20 or the open rows in all of the banks 20 within the SDRAM 10. Examples of other well known commands include, but are not limited to, the ACTIVE, READ, WRITE, BURST TERMINATE, AUTO REFRESH, LOAD MODE REGISTER, COMMAND INHIBIT and NOP commands.

The ACTIVE command is used to open up (or activate) a row of memory cells in a particular bank 20 for a subsequent access. The row remains active until a PRECHARGE command deactivates it. The READ command is used to initiate a burst read access for an active row. The WRITE command is used to initiate a burst write access for an active row. The READ and WRITE commands will also be accompanied with the column and bank addresses to complete the addressing for the command. The AUTO REFRESH command is used to refresh the contents of the memory arrays 20. The BURST TERMINATE command is used to truncate a read burst. The LOAD MODE REGISTER allows a mode register of the control circuit 12 to be loaded. The mode register contains information such as burst length and type. The COMMAND INHIBIT command is used to prevent new commands from being executed by the SDRAM 10. The NOP (no-operation) command is used to prevent unwanted commands from being registered while the SDRAM 10 is in an idle or wait state. Operations already in progress, however, are not affected by the COMMAND INHIBIT and NOP commands and are allowed to complete.

The control circuit 12 is connected to and passes control signals to the addressing circuit 40. The addressing circuit 40 also receives address signals A0–A11 and bank address signal BA0, BA1 as inputs. The addressing circuit 40 provides row and bank addresses to the row decoders 14. The addressing circuit 40 also provides column and bank addresses to the column decoders 18. The row decoders 14 activate the addressed row of the appropriate bank of memory 20. The column decoders 18 activate the addressed column of the appropriate bank of memory 20 (through the input/output circuit 30 and the sense amplifiers 16). In a preferred embodiment, only one bank 20 will be addressed and thus, accessed at a time.

With reference to FIGS. 1 and 2, in a preferred embodiment, the address and bank address signals A0–A11, BA0, BA1 provide a row address (for the bank 20 identified by BA0, BA1) when the SDRAM 10 receives an ACTIVE command. The address and bank address signals A0–A9 (for "×4" or A0–A8 for "×8"), BA0, BA1 provide a column address when the SDRAM 10 receives a command such as, for example, a READ or WRITE. The addressing circuit 40 will generate a second column address for the same addressed bank 20 from the received column address. The second column address, however, will be for a plane 20a, 20b that is different than the plane 20a, 20b addressed by the received column address. The two column addresses are used by the column decoders 18 to generate respective column select signals 26 (one for plane 20a and one for plane 20b) which in turn activates a column of memory in each column section 21a, 22a, 23a, 24a (plane 20a) and 21b, 22b, 23b, 24b (plane 20b) in the addressed bank 20. As stated above, only one of the four banks 20 will be accessed at a time.

Figure 6:
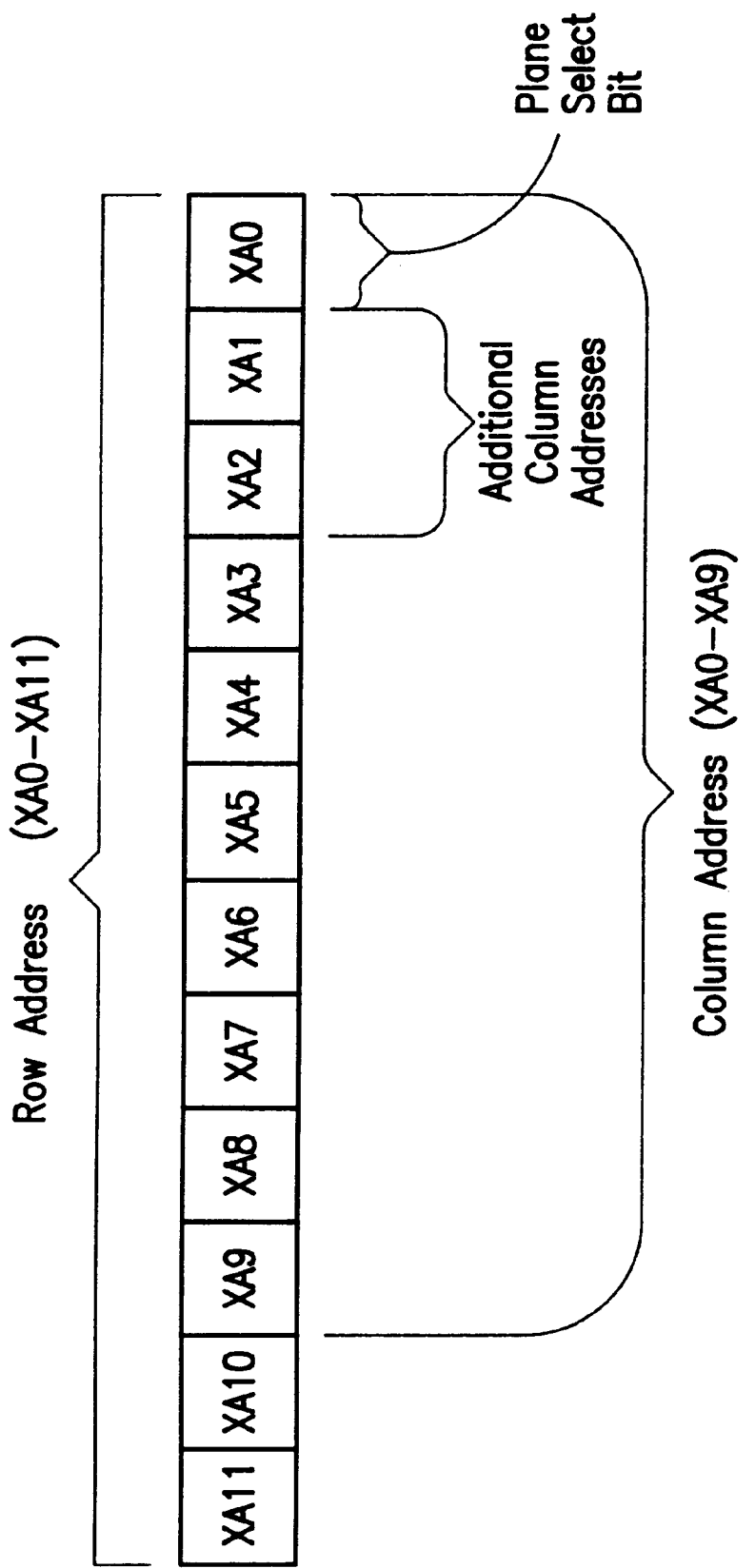
FIG. 6 illustrates addressing bits used in the writing scheme of the SDRAM constructed in accordance with the present invention.

The addressing circuit 40 of the present invention will receive one external row and bank address with the ACTIVE command (described above with reference to FIG. 1). The addressing circuit 40 will also receive one external column and bank address with either the READ or WRITE command and generate a second column addresses (so there will be a column address for each plane within a memory bank) without waiting for the falling edge of the system clock. FIG. 6 illustrates external address bits XA0–XA11. A row address will consist of address bits XA0–XA11 while a column address will consist of bits XA0–XA9.

The addressing circuit 40 will utilize address bit XA0 of the received column address to determine which plane the received column address is for. That is, the column address accompanying the READ or WRITE command corresponds to either plane 20a or 20b of the addressed bank 20 (FIG. 2). When the received column address bit XA0 is set to 0, for example, the addressing circuit 40 will use the received column address to access plane 20a and the generated column address to access the plane 20b. Likewise, when column address bit XA0 is set to 1, for example, the addressing circuit 40 will use the received column address to access plane 20b and the generated column address to access the plane 20a. It must be noted that the addressing circuit 40 could also be configured to use the received column address to access plane 20b when column address bit XA0 is set to 0 and the generated column address to access the plane 20a.

As will be described below, for a burst WRITE command, both the received column address and the generated second column address will each be used to predict additional addresses to complete the burst access. The prediction occurs by incrementing address bits XA1 and XA2 (FIG. 6) and thus, creating a new address bits XA0–XA9, by a burst counter. Additional addresses predicted from the received column address will correspond to the plane of the received address. Additional addresses predicted from the generated second column address will correspond to the plane of the second column address.

For convenience purposes only, the following description will refer to the first plane 20a as the LEFT plane and the second plane 20b as the RIGHT plane. Any signals or addresses that are to be used by either the LEFT or RIGHT plane, but not both, will include the label "LEFT" or "RIGHT." An exemplary addressing scheme that can be used with the invention is disclosed in a co-pending application entitled "An Addressing Scheme for a Double Data Rate SDRAM," Ser. No. 09/204,073, filed on the same day as this application, the contents of which are hereby incorporated herein by reference.

Figure 3:
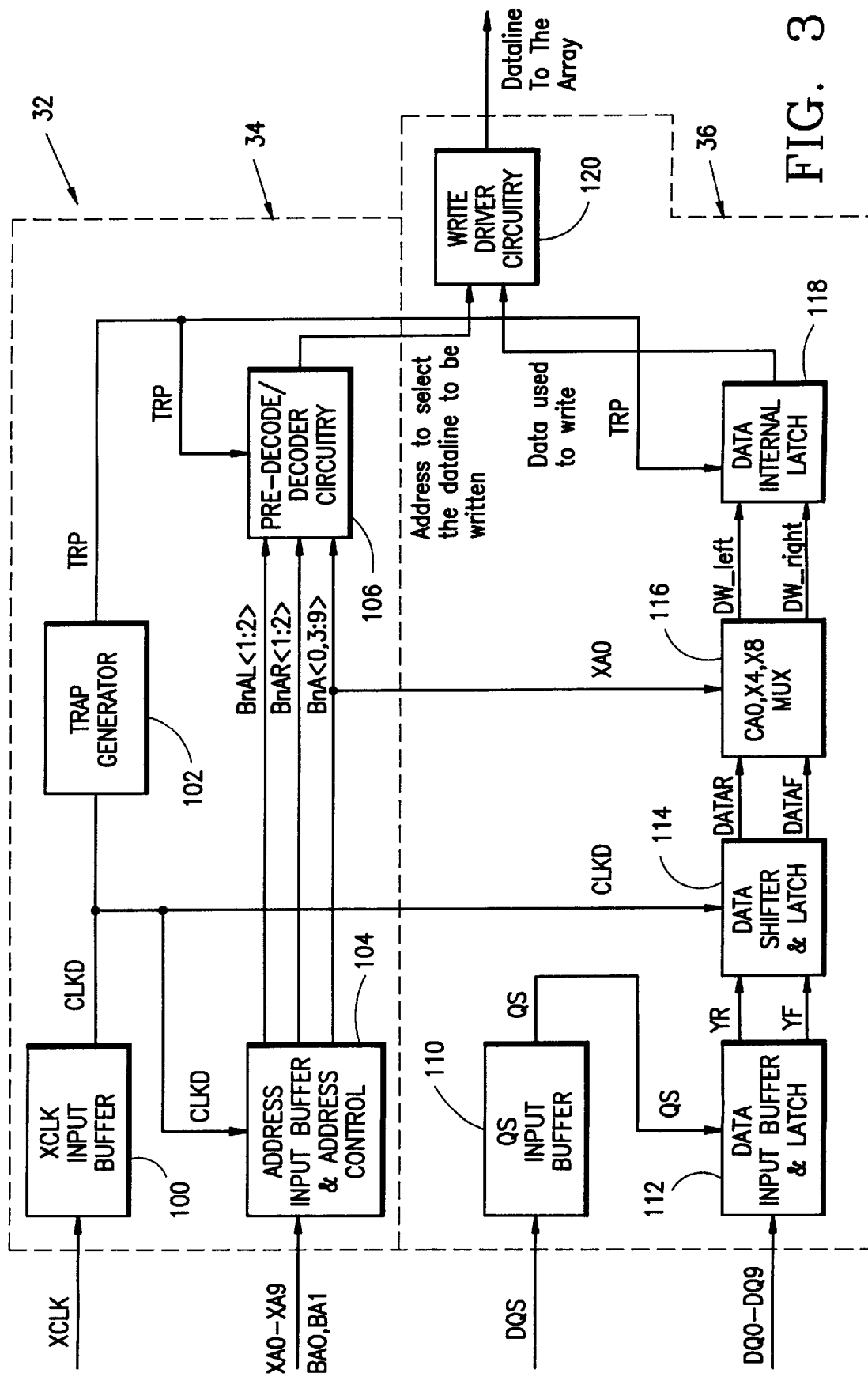
FIG. 3 illustrates an exemplary write path circuit utilized in the SDRAM of FIG. 1.

FIG. 3 illustrates a detailed block diagram of an exemplary write path circuit 32 constructed in accordance with a preferred embodiment of the present invention. The write circuit 32 includes an addressing portion 34 and a write data latching portion 36. The addressing portion 34 includes an external clock (XCLK) input buffer 100, trap (TRP) generator 102, address input buffer and control circuit 104 and pre-decode/decoder circuitry 106. The write data latching portion 36 includes a data strobe (QS) input buffer 110, data input buffer and latch circuit 112, data shifter and latch circuit 114, multiplexer 116, data internal latch 118 and write driver circuitry 120.

As described above, the addressing portion 34 will predict a second column addresses from the received column address bits XA0–XA9. The received column address and the predicted column address will be used to address two individual planes of the same memory bank, which allows two sets of input data to be written into one bank at the same time.

The XCLK input buffer receives an external clock signal XCLK and outputs an internal clock signal CLKD responsive to the first edge of the external clock signal XCLK. In a preferred embodiment, the external clock signal XCLK is the system clock of a system utilizing the SDRAM of the present invention. Once the internal clock signal CLKD is generated, the signal CLKD is used to drive the remainder of the addressing and write data latching portions 34, 36. The CLKD signal is connected the TRP generator 102 which generates a trap signal TRP used by the pre-decoder/decoder circuitry 106 and the data internal latch 118. The use of the trap signal TRP will be discussed in further detail below.

The internal clock signal CLKD is connected to the address input buffer and control circuit 104. The circuit 104 receives an external column address signal XA0–XA9 and bank address signals BA0, BA1 and outputs three address portion signals BnAL<1:2>, BnAR<1:2>, BnA<0,3:9> (where "n" equals bank number 0, 1, 2, or 3). These address signals BnAL<1:2>, BnAR<1:2>, BnA<0,3:9> of the address input buffer and control circuit 104 will be used by the pre-decoder/decoder circuitry 106 to generate respective column select signals used to activate a column within the LEFT plane of the addressed memory bank and to activate a column within the RIGHT plane of the same memory bank. The pre-decoder/decoder circuitry 106 receives the three address signals BnAL<1:2>, BnAR<1:2>, BnA<0, 3:9> from the address input buffer and control circuit 104 and subsequently latches and outputs these signals upon the receipt of the trap signal TRP. The trap signal TRP is used to synchronize the addressing portion 34 to the write data latching portion 36 which is responsible for inputting, latching and re-aligning input data received over the input/output pins DQ0–DQ7. It must be noted that a row address was received by the addressing portion 34 with an ACTIVE command received immediately prior to the WRITE command, the row address is sent to the pre-decoder/decoder circuitry 106 prior to the operations described above for the column addresses and no further description of the row address is required.

The QS input buffer 110 of the write data latching portion 36 receives the external data strobe DQS and outputs an internal data strobe QS. The internal data strobe QS is used to drive the data input and latch circuitry 112. The data input and latch circuitry 112 receives as an input the data received over the input/output pins DQ0–DQ7.

Figure 4:
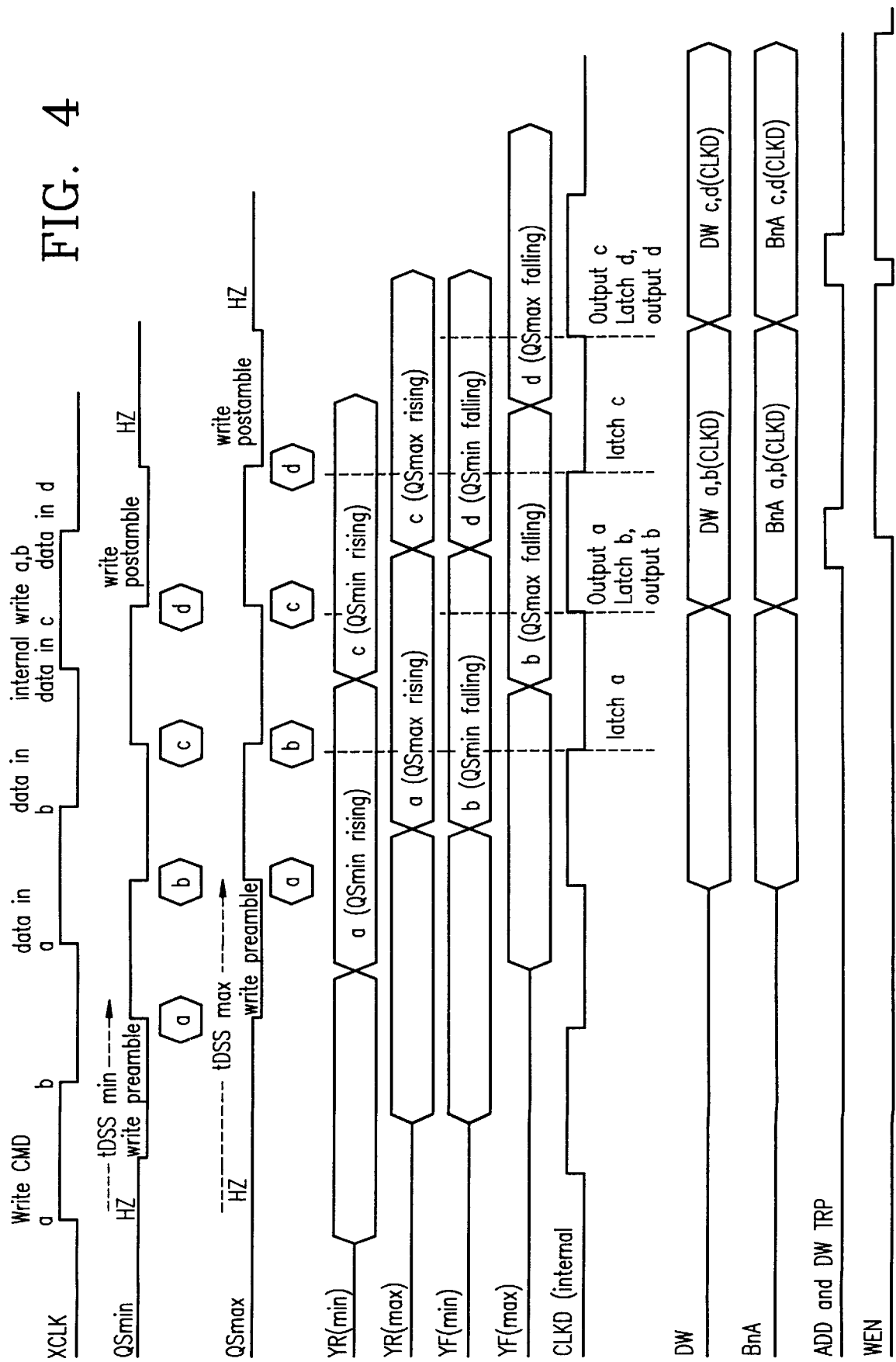
FIG. 4 is a timing diagram of the writing scheme of the SDRAM of FIG. 1.

Referring to FIG. 4, the input data will be latched according to the internal data strobe signal QS. Data received and latched at the rising edge of the internal data strobe QS will be referred to as rising edge data YR and data received and latched at the falling edge of QS will be referred to as falling edge data YF. FIG. 4 illustrates a minimum and maximum timing for the signals QS, YR and YF. These minimum and maximum timings correspond to the minimum and maximum latency variations of the external data strobe DQS discussed above. As will be shown, however, the circuitry of the write path circuit 32 will not be adversely effected by the latency variations of the external data strobe DQS because the circuit 32 is being driven by the internal clock signal CLKD and two sets of data will be written into respective planes of a memory bank at the same time. FIG. 4 also illustrates a burst WRITE access having four pieces of data a, b, c and d.

Referring to FIGS. 3 and 4, the rising and falling edge outputs YR and YF of the data input buffer and latch circuit 112 are sent to the data shifter and latch circuit 114 which synchronizes them to the internal clock signal CLKD. The data shifter and latch circuit 114 outputs synchronized rising and falling edge data DATAR, DATAF to the inputs of the multiplexer 116.

The multiplexer has two outputs DW_LEFT, DW_RIGHT corresponding to data to be written into the LEFT plane (i.e., DW_LEFT) of an addressed memory bank and data to be written into the RIGHT plane (i.e., DW_RIGHT) of the same bank. Therefore, the rising edge data DATAR will go to either the LEFT or RIGHT plane while the falling edge data DATAF will go to the other plane. The multiplexer 116 is controlled by the plane select bit XA0. As stated earlier, the plane select bit XA0 determines whether the initially received column address corresponds to the LEFT or RIGHT plane. It must be noted that the received address is aligned to the rising edge of the data strobe DQS. Therefore, the data received with the received address is also aligned to the rising edge and will be referred to as rising edge data. If the received address corresponds to the LEFT plane (XA0=0), for example, then the rising edge data DATAR will be destined for the LEFT plane while the falling edge data DATAF will be destined for the RIGHT plane. Similarly, if the received address corresponds to the RIGHT plane (XA0=1), for example, then the rising edge data DATAR will be destined for the RIGHT plane while the falling edge data DATAF will be destined for the LEFT plane.

Accordingly, the plane select bit XA0 is used to control the multiplexer 116 by outputting the rising edge data DATAR as the output DW_LEFT if the rising edge data DATAR is destined for the LEFT plane (i.e., XA0=0) or the output DW_RIGHT if the rising edge data DATAR is destined for the RIGHT plane (i.e., XA0=1). The falling edge data DATAF will be output as DW_RIGHT when the rising edge data DATAR is output as DW_LEFT. The falling edge data DATAF will be output as DW_LEFT when the rising edge data DATAR is output as DW_RIGHT. The multiplexer 116 outputs DW_LEFT, DW_RIGHT are sent to the data internal latch 118. As illustrated in FIG. 4, the internal latch 118 sequentially latches and simultaneously outputs (illustrated in FIG. 4 as DW a,b (CLKD)) the multiplexer outputs DW_LEFT, DW_RIGHT upon the receipt of the trap signal TRP. As stated earlier, the trap signal TRP synchronizes the addresses generated by the addressing portion 34 (illustrated in FIG. 4 as BnA a,b (CLKD)) to the data being latched and output from the write data latching portion 36 (DW a,b (CLKD)). Write circuitry 120 uses the addresses output by the addressing portion 34 and the latched data from the write data latch portion to simultaneously access, and write data into, the two planes of the addressed bank.

As stated earlier, FIG. 4 illustrates a burst WRITE operation where four pieces of data a, b, c, d are being input for each WRITE command (labeled as "Write CMD" over the first rising edge of the external clock signal XCLK). As shown, the four pieces of data a, b, c, d are registered to either rising or falling edges of the internal data strobe QS (illustrated by hexagons a, hexagons b, hexagons c and hexagons d below the rising and falling edges of QSmin and QSmax).

As stated earlier, the external data strobe DQS and thus, the internal data strobe QS will have an industry standard varied latency relative to the external clock signal XCLK (shown as QSmin and QSmax). If the QS has the minimum latency, for example, the data a, b, c, d will be input and aligned to the QSmin. The latched rising and falling edge data YR, YF will also be aligned to QSmin (illustrated as YR(min) and YF(min)). If the QS has the maximum latency, for example, the data a, b, c, d will be input and aligned to the QSmax. The latched rising and falling edge data YR, YF will also be aligned to QSmax (illustrated as YR(max) and YF(max)). It must be noted, however, that the write path circuitry 32 latches and outputs the data at a constant timing (or latency) regardless of the alignment of the incoming data since the data is re-aligned, shifted and output according to the internal clock signal CLKD (as illustrated by the timing of the DW and BnA signals).

As shown, the first piece of data, i.e., data a is latched (illustrated as "latch a" underneath one of the edges of the internal clock signal CLKD) and the second piece of data, i.e., data b is latched (illustrated as "latch b" underneath one of the edges of the internal clock signal CLKD) and both data a and b are output (illustrated as "output a" and "output b" underneath one of the edges of the internal clock signal CLKD) at a constant timing and in response to the same edge of the internal clock signal CLKD regardless of whether the data was aligned to QSmin or Qsmax (illustrated by the dotted lines intersecting YR (min), YR(max), YF(min) and YF(max)). This is further illustrated by the fact that the DW a,b (CLKD) and the BnA a,b (CLKD) are also synchronized to the same edge of the internal clock signal CLKD (also illustrated by the dotted lines intersecting YR (min), YR(max), YF(min) and YF(max)). The remainder of the burst, that is, the outputting of the third and fourth pieces of data (data c and d) is similarly performed. A write enable signal WEN is also illustrated to show the time period in which the data can be written into the two planes of the memory bank.

Figure 5:
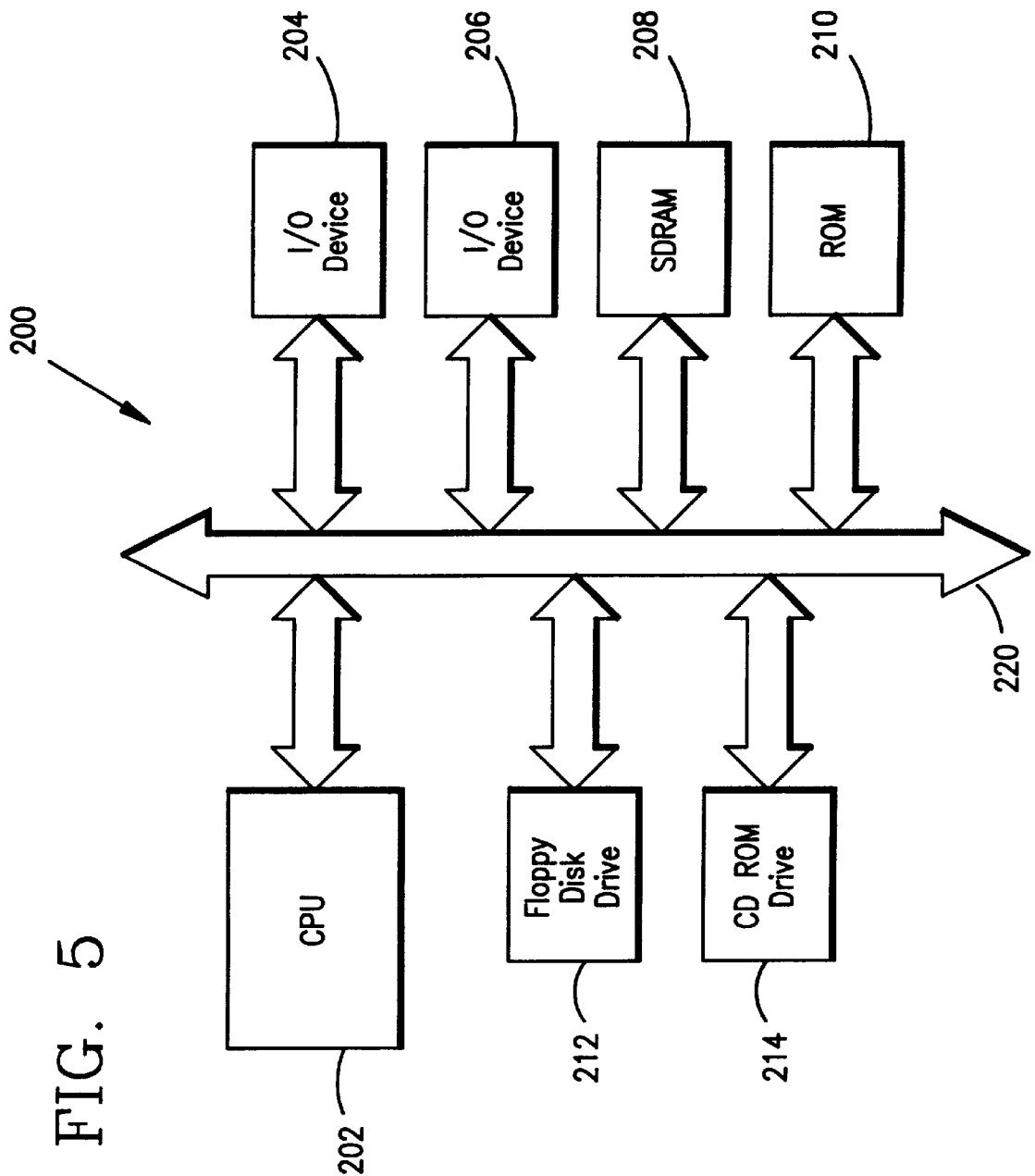
FIG. 5 illustrates a computer system utilizing a SDRAM constructed in accordance with the present invention.

FIG. 5 illustrates a computer system 200 including a SDRAM 208 constructed in accordance with the present invention. The SDRAM 208 operates as described above with reference to FIGS. 1–4. The computer system 200 also includes a central processing unit (CPU) 202 that communicates to the SDRAM 208 and an I/O device 204 over a bus 220. A second I/O device 206 is illustrated, but is not necessary to practice the invention. The computer system 200 also includes read only memory (ROM) 210 and may include peripheral devices such as a floppy disk drive 212 and a compact disk (CD) drive 214 that also communicate with the CPU 202 over the bus 220 as is well known in the art.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of writing data into a memory device, the memory device comprising at least one memory bank, said memory bank being divided into at least two planes of memory cells, said method comprising the steps of:
   receiving first data associated with a first transition of a first strobe signal;
   receiving second data associated with a second transition of the first strobe signal;
   aligning the first and second data to a first clock signal; and
   simultaneously outputting the aligned first and second data to separate planes of the at least one memory bank.

2. The method of claim 1 wherein the first and second transitions of the first strobe signal are associated with a second clock signal and said method outputs the aligned first and second data at a constant timing regardless of a latency of the first strobe signal with respect to the second clock signal.

3. The method of claim 1 wherein the first and second transitions of the first strobe signal are associated with a second clock signal and said method further comprises the step of generating the first clock signal responsive to a first portion of the second clock signal.

4. The method of claim 1 wherein the first and second transitions of the first strobe signal are associated with a second clock signal and said method further comprises the step of generating the first clock signal responsive to a rising edge of the second clock signal.

5. The method of claim 1 further comprising the steps of:
   receiving a first address corresponding to a location within at least a first plane of one of said at least one memory bank; and
   generating a second address corresponding to a location within at least a second different plane of a same memory bank, wherein said method respectively outputs the aligned first and second data to memory locations within the separate planes corresponding to the first and second addresses.

6. The method of claim 5 wherein a portion of the first address is used as an identifier for the planes of the memory banks.

7. The method of claim 1 further comprising the steps of:
   receiving third data associated with a third transition of the first strobe signal;
   receiving fourth data associated with a fourth transition of the first strobe signal;
   aligning said third and fourth data to the first clock signal; and
   simultaneously outputting the aligned third and fourth data to the separate planes of the at least one memory bank.

8. The method of claim 7 wherein the transitions of the first strobe signal are associated with a second clock signal and said method outputs all of the aligned data at a constant timing regardless of a latency of the first strobe signal with respect to the second clock signal.

9. A method of writing data into a memory device, the memory device comprising at least one memory bank, said memory bank being divided into at least two planes of memory cells, said method comprising the steps of:
   receiving first and second data respectively associated with first and second transitions of a first strobe signal, the first strobe signal being associated with a first clock signal;
   generating a second clock signal responsive to a first portion of the first clock signal;
   aligning the first and second data to the second clock signal; and
   simultaneously outputting the aligned first and second data to separate planes of the at least one memory bank.

10. The method of claim 9 wherein said method outputs the aligned first and second data at a constant timing regardless of a latency of the first strobe signal with respect to the first clock signal.

11. The method of claim 9 wherein said method generates the second clock signal responsive to a rising edge of the first clock signal.

12. The method of claim 9 further comprising the steps of:
   receiving a first address corresponding to a location within at least a first plane of one of said at least one memory bank; and
   generating a second address corresponding to a location within at least a second different plane of a same memory bank, wherein said method outputs the aligned first and second data to respective memory locations within the separate planes corresponding to the first and second addresses.

13. The method of claim 12 wherein a portion of the first address is used as an identifier for the planes of the memory banks.

14. The method of claim 9 further comprising the steps of:
   receiving third and fourth data respectively associated with third and fourth transitions of the first strobe signal;
   aligning the third and fourth data to the second clock signal; and
   simultaneously outputting the aligned third and fourth data to separate planes of the at least one memory bank.

15. The method of claim 14 wherein said method outputs all of the aligned data at a constant timing regardless of a latency of the first strobe signal with respect to the first clock.

16. A method of writing data into a synchronous dynamic random access memory (SDRAM) device, the SDRAM comprising at least one memory bank divided into at least two planes of memory cells, said method comprising the steps of:

receiving a first address corresponding to a location within a first plane a memory bank;

generating a second address corresponding to a location within a second different plane of a same memory bank;

receiving first data associated with a first transition of a first strobe signal;

receiving second data associated with a second transition of the first strobe signal, the first strobe signal being associated with a first clock signal;

generating a second clock signal responsive to a first portion of the first clock signal;

aligning the first and second data to the second clock signal; and applying the first and second addresses and the aligned data simultaneously to circuitry of said SDRAM so that the aligned first and second data are output at a constant timing regardless of a latency of the first strobe signal with respect to the first clock signal.

17. The method of claim 16 wherein a portion of the first address is used as an identifier for the planes of the memory banks.

18. The method of claim 16 further comprising the steps of:

receiving third data associated with a third transition of the first strobe signal;

receiving fourth data associated with a fourth transition of the first strobe signal;

aligning said third and fourth data to the second clock signal; and simultaneously outputting the aligned third and fourth data to the separate planes of the at least one memory bank.

19. The method of claim 18 wherein said method outputs all of the aligned data at a constant timing regardless of a latency of the first strobe signal with respect to the first clock signal.

* * * * *